United States Patent [19]
Nagase et al.

[11] Patent Number: 5,117,105
[45] Date of Patent: May 26, 1992

[54] ABSOLUTE ENCODER

[75] Inventors: Takashi Nagase; Kouichi Higashi, both of Iruma, Japan

[73] Assignee: Kabushiki Kaisha Yaskawa Denki Seisakusho, Kitakyushu, Japan

[21] Appl. No.: 651,387

[22] PCT Filed: Jan. 23, 1990

[86] PCT No.: PCT/JP90/00072
§ 371 Date: Mar. 7, 1991
§ 102(e) Date: Mar. 7, 1991

[30] Foreign Application Priority Data

Jul. 7, 1989 [JP] Japan .................... 1-174121

[51] Int. Cl.⁵ .................................. G01D 5/34
[52] U.S. Cl. ...................... 250/231.18; 341/13
[58] Field of Search .......... 250/231.18, 237 G; 341/11, 13

[56] References Cited

U.S. PATENT DOCUMENTS 4,720,699  1/1988  Smith ................. 250/237 G
5,038,243  8/1991  Gordon .............. 250/231.13

FOREIGN PATENT DOCUMENTS 50-99564  8/1975  Japan .
53-19852  2/1978  Japan .
54-39653  3/1979  Japan .
8703361   6/1987  World Int. Prop. O. .

OTHER PUBLICATIONS

IEEE Tr. On Instr. and Measurement; vol. IM-36, No. 4, Dec. 1987, N.Y., USA pp. 950-955; Emil M. Petriu: "Absolute-Type Position Transducers Using a Pseudo-random Encoding" FIG. 1; Tables 1, 2.

*Primary Examiner*—David C. Nelms
*Assistant Examiner*—T. Davenport
*Attorney, Agent, or Firm*—Oblon, Spivak, McClelland, Maier & Neustadt

[57] ABSTRACT

A sequence of random numbers of a desired length is produced using an algorithm for shifting a binary code M bits and adding 0 or 1 so that all produced codes are different from each other. An absolute encoder of a desired resolution is provided using such a sequence of random numbers. Where a slit pattern of M-series random number codes is employed, a circuit for generating a pattern comprising a combination of the M-series random number codes and 0s is employed to provide an absolute encoder having a resolution of $2^k$.

4 Claims, 5 Drawing Sheets

ABSOLUTE ENCODER

FIELD OF THE INVENTION

The present invention relates to an absolute encoder employing recurring decimal codes.

DESCRIPTION OF THE PRIOR ART

Heretofore, general absolute encoders have used a code plate having a plurality of tracks having different numbers of slits and arranged radially to produce binary codes or gray codes having the desired number of bits. With such an arrangement, however, it is difficult to provide a compact high-resolution absolute encoder since the number of tracks increases as the number of bits increases.

One solution to the above problem is an absolute encoder which employs M-series random numbers.

Figure 7:
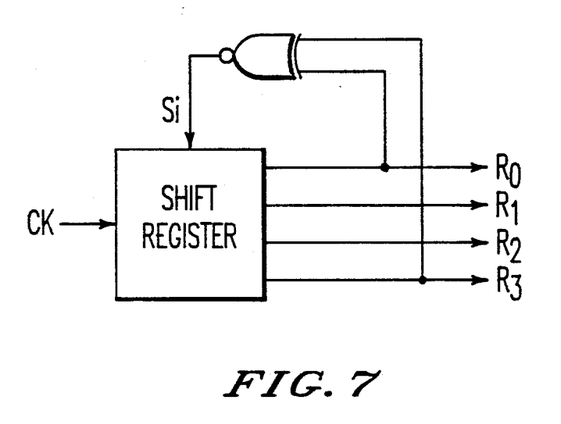
FIG. 7 is a block diagram of the circuit for generating M-series random numbers.

As is well known in the art, the M-series random numbers are the longest sequence of numbers that can be produced using a shift register A k-bit shift register can generate recurring patterns of $2^k-1$ codes other than 0. For exmaple, a 4-bit shift register as shown in FIG. 7 produces codes given in Table 1, below, on the condition that R0 through R3 in FIG. 7 do not become 0 at the same time.

TABLE 1

| No. | $R_3$ | $R_2$ | $R_1$ | $R_0$ |
|---|---|---|---|---|
| 1 | 0 | 0 | 0 | 1 |
| 2 | 0 | 0 | 1 | 1 |
| 3 | 0 | 1 | 1 | 1 |
| 4 | 1 | 1 | 1 | 1 |
| 5 | 1 | 1 | 1 | 0 |
| 6 | 1 | 1 | 0 | 1 |
| 7 | 1 | 0 | 1 | 0 |
| 8 | 0 | 1 | 0 | 1 |
| 9 | 1 | 0 | 1 | 1 |
| 10 | 0 | 1 | 1 | 0 |
| 11 | 1 | 1 | 0 | 0 |
| 12 | 1 | 0 | 0 | 1 |
| 13 | 0 | 0 | 1 | 0 |
| 14 | 0 | 1 | 0 | 0 |
| 15 | 1 | 0 | 0 | 0 |

The M-series random numbers thus produced are composed of recurring patterns of different $2^k-1$ codes. If a code disc has a circumferential array of opaque areas representing "0" and transparent areas representing "1" and a pattern of adjacent k bits representing opaque and transparent areas is read from the array, then an absolute circumferential position on the disc can be determined since there is only one such pattern on the circumference of the disc.

SUMMARY OF THE INVENTION

General absolute encoders are of the resolution of $2^k$ using binary codes or gray codes. The above absolute encoder with the M-series random numbers can achieve a resolution of only $2^k-1$ and is not compatible with the general value encoders.

It is an object of the present invention to provide an absolute value encoder having a particular resolution.

A first absolute encoder according to the present invention comprises a code plate divided into N equal slits each coded 0 or 1 for producing a sequence of recurring random numbers whose binary codes ($B_1$-$B_N$) composed of successive P slits are different from each other and a detector device for reading the codes of successive P slits of the code plate so that the absolute angle of the code disc within one revolution can be detected.

Figure 1:
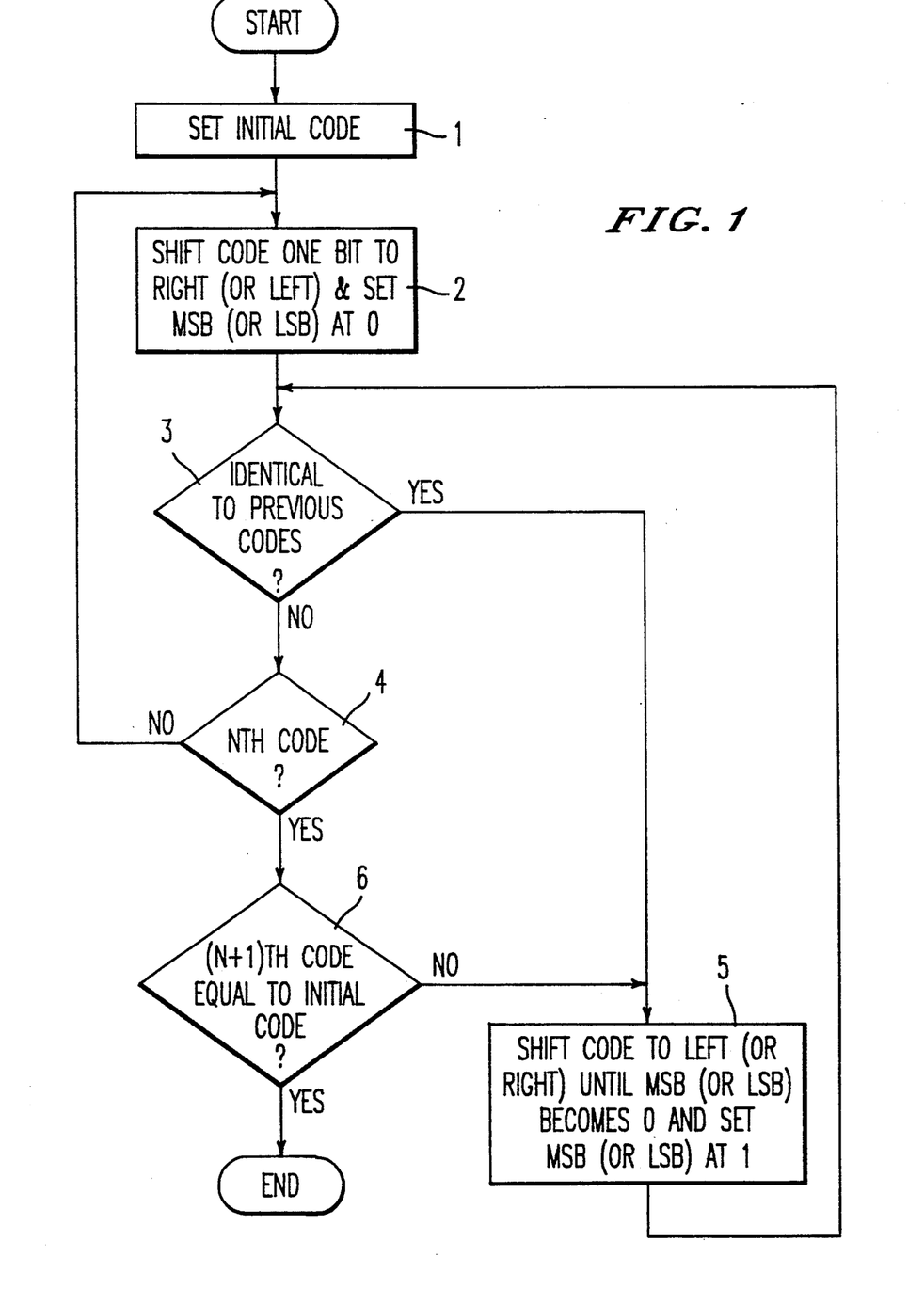
FIG. 1 is a flowchart of the process for generating recurring random number codes with the first absolute encoder according to the present invention.

FIG. 1 is a flowchart of the process for generating recurring random number codes with the first absolute encoder.

First, the first P-bit code $B'_1$ composed of 0 or 1 is established in step 1. The P bits serve as the first P numbers of a sequence of random numbers. Then, the initial code $B'_1$ is shifted one bit to the right (or the left) in step 2. If the initial code $B'_1$ is shifted to the left, then the processing is executed as indicated in the parentheses below. The MSB (most significant bit)) (or LSB (least significant bit)) of the initial code $B'_1$ after it has been shifted to the right (or the left) is set at 0. This bit serves as the (P+1)th number of a sequence of random numbers. A newly generated P-bit code $B'_2$ and the initial code $B'_1$ are compared with each other in step 3. If the two codes differ from each other, control goes to step 4, and if the two codes are equal, control goes to step 5. Step 4 determines whether the new code is an Nth code or not. If the new code is an Nth code, control goes to step 6, and if the new code is not an Nth code, control returns to step 2. It is now assumed that at an ith code $B'_i$ is generated, and control goes from step 4 back to step 2. In step 2, this code is shifted one bit to the right (or the left), and the MSB (or the LSB) is set at 0, producing a new code $B'_{i+1}$. Step 3 then determines whether any of the previous codes $B'_1$ through $B'_i$ is the same as code $B'_{i+1}$. If not, control goes to step 4. If any of the previous codes is the same as code $B'_{i+1}$, then step 5 changes the MSB (or the LSB) from 0 to 1, and control goes back to step 3. If the new code $B'_{i+1}$ is the same as any of the previous codes $B'_1$ through $B'_i$ in step 3, control goes again to step 5. At this time, the MSB (or the LSB) is already 1. The code is shifted to the left (or the right) until the MSB (or the LSB) of the sequence of random numbers becomes 0. That is, the code is shifted up to a code $B'_p$ whose MSB (or LSB) is 0, and the code produced by setting the MSB (or the LSB) of the code $B'_p$ to 1 is established as a new code $B'_p$, after which control goes to step 3. The above process is repeated.

When the Nth code $B'_N$ is generated in step 4, step 6 determines whether the code produced by shifting code $B'_N'$ one bit to the right (or the left) is equal to the initial code $B'_1$ or not. If equal, then the process is finished, and if not equal, then control goes to step 5. In this manner, recurring random number codes are produced.

The same sequence of recurring random numbers is produced even if the MSB (or the LSB) of the code is set at 1 after the code has been shifted to the left (or the right) in step 2. In this case, 0 and 1 should be changed to 1 and 0, respectively, in the following steps.

A second absolute encoder according to the present invention comprises a code plate divided into N equal slits each coded 0 or 1 for producing a sequence of recurring random numbers whose P-bit binary codes ($B_1$-$B_N$) composed of P slits, which are M slits apart, are different from each other and a detector device for reading the codes of successive P slits, which are M slits apart, of the code plate so that the absolute angle of the code disc within one revolution can be detected.

Figure 2:
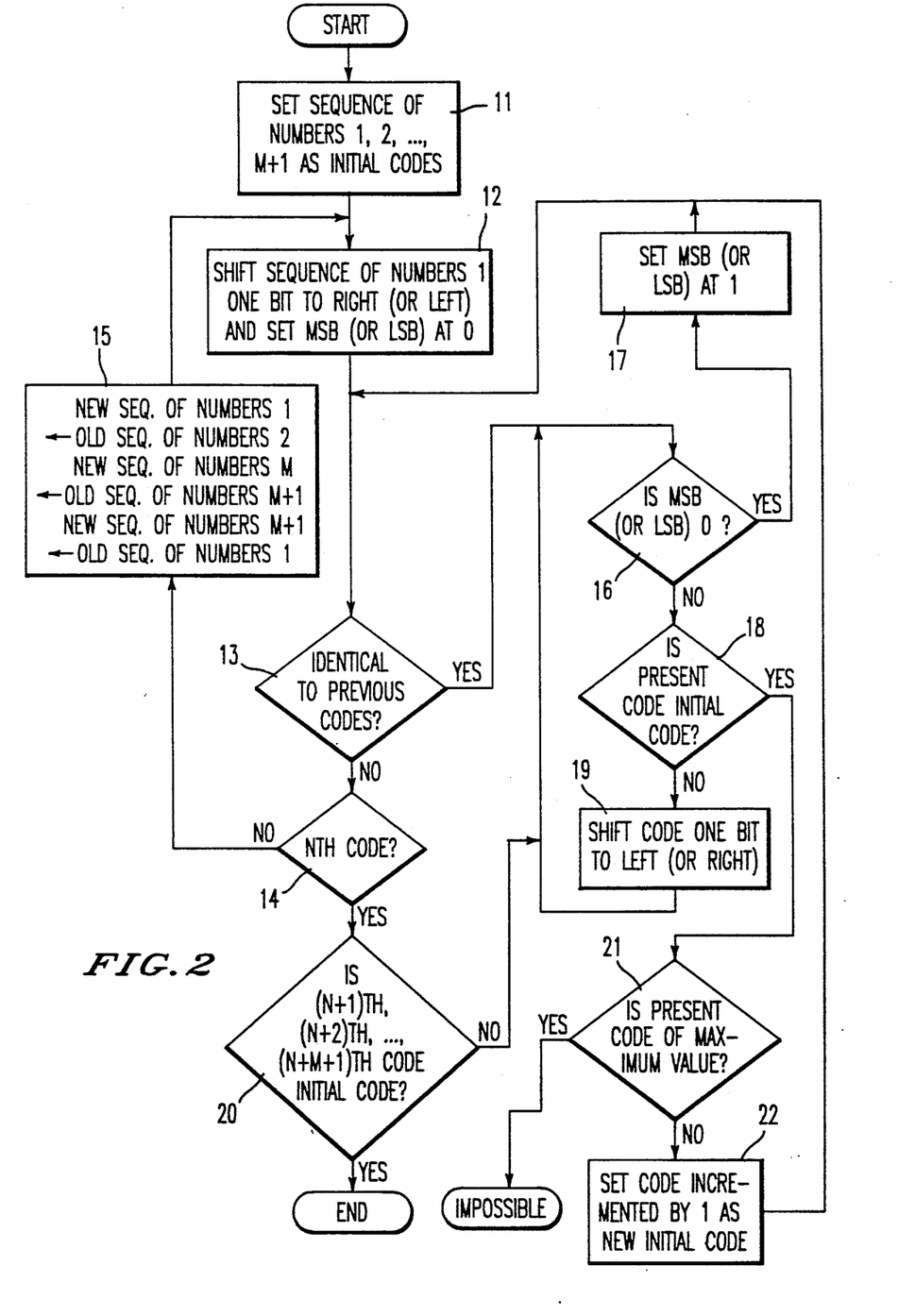
FIG. 2 is a flowchart of the process for generating recurring random number codes with the second absolute encoder according to the present invention.

FIG. 2 is a flowchart of the process for generating recurring random number codes with the second absolute encoder.

The process shown in FIG. 2 generates a sequence of random numbers having a length N, which are M apart.

Sequences of P-bit numbers 1, 2, . . . , M+1 each composed of 0 or 1 with N represented by a binary number are initially established in step 11. These binary codes are referred to as $B'_1, B'_2, \ldots, B'_{M+1}$, respectively. A sequence of numbers having a length $(M+1)P$ in which the bits of the sequences of numbers $1, 2, \ldots, M+1$ are arranged in the order of these sequences of numbers $1, 2, \ldots, M+1$, is referred to as an initial sequence of random numbers. Then, the sequence of numbers 1 is shifted one bit to the right (or the left) in step 12. If it is shifted to the left, the processing is executed as indicated in the parentheses below. The MSB (or the LSB) of the code after it has been shifted t the right (or the left) is set at 0. The newly generated P-bit code $B'_{M+2}$ is compared with previous codes $B'_1, B'_2, \ldots, B'_{M+1}$ in order to determine whether code $B'_{M+2}$ is equal to any of the previous codes in step 13. If the compared codes differ from each other, then control goes to step 14, and if the compared codes are equal, control goes to step 16. In step 14, the MSB (or the LSB) of the sequence of numbers 1 is placed on the lefthand side (or the righthand side) of the MSB (or the LSB) of the sequence of random numbers, thus producing a sequence of $(M+1)P+1$-bit random numbers. Step 14 also determines whether the new code is an Nth code or not. If the new code is an Nth code, control goes to step 20, and if the new code is not an Nth code, control returns to step 15. In step 15, the sequence of numbers 2 is replaced with a new sequence of numbers $1, \ldots,$ the sequence of numbers $M+1$ with a new sequence of numbers $M$, and the sequence of numbers 1 with a new sequence of numbers $M+1$. Then, step 12 is carried out for the new sequence of numbers 1 to produce a new code $B'_{M+3}$. Step 16 determines whether the MSB (or the LSB) of the sequence of numbers 1 to 0 or not. If it is 0, control goes to step 17, and if not, control goes to step 18. In step 17, the MSB (or the LSB) is changed to 1, and control then goes to step 13. Step 18 determines whether the present code is equal to any one of the initial codes $B'_1, B'_2, \ldots, B'_{M+1}$ or not. If equal, control goes to step 21, and if not equal, control goes to step 19. In step 19, each of the sequences of numbers $1, 2, \ldots, M+1$ is shifted one bit to the left (or the right), and control then goes back to step 16. At this time, the sequence of random numbers is shifted back by $M+1$ bits. In the loop composed of the steps 16, 18, 19, the sequence of numbers 1 is shifted to the left (or the right) until the MSB (or the LSB) of the sequence of numbers 1 becomes 0 or the sequence of numbers 1 becomes an initial code. Step 21 determines whether the present code is of the maximum value which can be taken by a P-bit binary number. If not the maximum value, control goes to step 22, and if it is the maximum value, the process is finished since no sequence of random numbers can be produced by the algorithm shown in FIG. 2. In step 22, the code produced by incrementing the present code by 1 is referred to as the new initial code, and control then goes to step 13.

It is assumed that codes up to the ith code $B'_i$ are generated, and then control goes to step 12. In step 12, the new sequence of numbers 1 is shifted one bit to the right (or the left), and the MSB (or the LSB) is set at 0, producing a new code $B'_{i+1}$. Step 13 then determines whether the code $B'_{i+1}$ is equal to any of the codes $B'_1, \ldots, B'_i$ or not. If not equal, then control goes to step 14. If equal, the MSB (or the LSB) is then changed from 0 to 1 in steps 16 and 17, and thereafter control goes to step 13. if the new code $B'_{i+1}$ is equal to any of the codes $B'_1, \ldots, B'_i$ in step 13, control returns to step 16. Since the MSB (or the LSB) is already 1 at this time, the code is shifted to the left (or the right) until the MSB (or the LSB) of the sequence of numbers 1 becomes 0. That is, the code is shifted up to a code $B'_j$ whose MSB (or LSB) bit is 0. In step 17, a code produced by changing the MSB (or the LSB) bit of the code $B'_j$ to 1 is set as a new code $B'_j$, after which control goes to step 13. The above process is repeated.

When codes up to an Nth code $B'_N$ are generated in step 14, step 20 determines whether codes $B'_{N+1}, \ldots, B'_{N+M+1}$ produced by shifting the codes $B'_{N-M}, \ldots, B'_N$ (i.e., the sequences of numbers $2, \ldots, M+1, 1$) one bit to the right (or the left) and setting the MSB (or the LSB) bit to 0 or 1 is equal to the initial codes $B'_1, \ldots, B'_{M+1}$ or not. If equal, the process is finished, and if not equal, control then goes to step 16. In this manner, a sequence of recurring random number codes having a length N, which are M bits apart, is produced.

The same sequence of recurring random numbers is produced even if the MSB (or the LSB) of the code is set at 1 after the code has been shfited to the left (or the right) in step 12. In this case, 0 and 1 should be changed to 1 and 0, respectively, in the following steps.

According to the present invention, as described above, there is provided an absolute encoder having a desired resolution.

Other features and advantages of the invention will be apparent from the following description taken in conjunction with accompanying drawings.

DETAILED DESCRIPTION OF THE PREFERRED EMBODIMENTS

Figure 3:
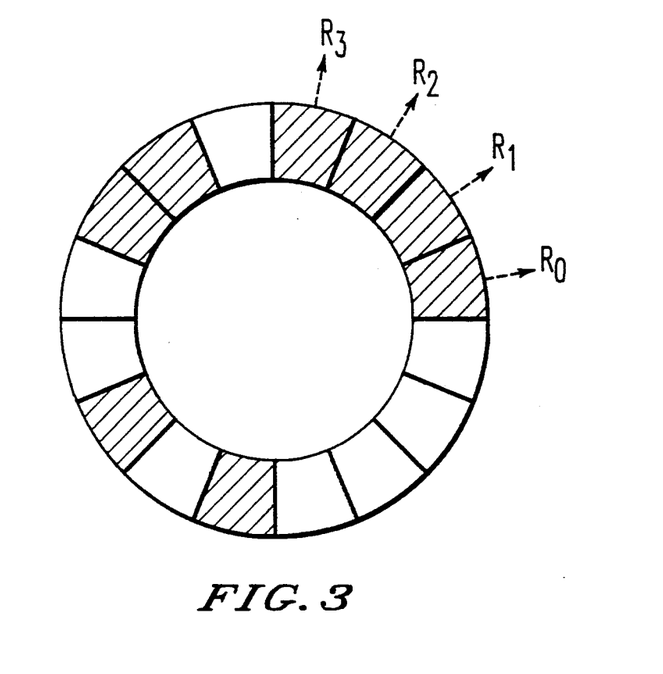
FIG. 3 is a view showing the code plate of an absolute encoder according to the first embodiment of the present invention.

FIG. 3 shows the code plate of the absolute encoder according to the first embodiment of the present invention.

If shaded areas on the code plate are read as "0" and white areas on the code plate as "1", a sequence of recurring random numbers:

$$\underbrace{1111010110010000}_{\text{one circumference}}$$

is produced. When these areas are read as adjacent 4-bit sequences of numbers $R_0$ through $R_3$ with a detector device, the circumference of the code plate is divided into 16 different patterns as shown at $R_0$ through $R_3$ in Table 2, below.

TABLE 2

| No. | $R_3$ | $R_2$ | $R_1$ | $R_0$ |
|---|---|---|---|---|
| 1 | 0 | 0 | 0 | 0 |
| 2 | 0 | 0 | 0 | 1 |
| 3 | 0 | 0 | 1 | 1 |
| 4 | 0 | 1 | 1 | 1 |
| 5 | 1 | 1 | 1 | 1 |
| 6 | 1 | 1 | 1 | 0 |
| 7 | 1 | 1 | 0 | 1 |
| 8 | 1 | 0 | 1 | 0 |
| 9 | 0 | 1 | 0 | 1 |
| 10 | 1 | 0 | 1 | 1 |
| 11 | 0 | 1 | 1 | 0 |
| 12 | 1 | 1 | 0 | 0 |
| 13 | 1 | 0 | 0 | 1 |
| 14 | 0 | 0 | 1 | 0 |
| 15 | 0 | 1 | 0 | 0 |
| 16 | 1 | 0 | 0 | 0 |

Table 3 shows the process of generating the sequence of recurring random numbers shown in Table 2, using the algorithm shown in FIG. 1. Here, the parameters are $N=16$, $P=4$ bits, and the codes are shifted to the right. The random number code produced each time control reaches step 3 shown in FIG. 1 is shown in Table 3.

and 5. Because the No. 3 code $B_2'$ differs from the No. 1 code $B_2'$ and N is not 16, the No. 3 code $B_2'$ is shifted one bit to the right, and the MSB is set at 0, producing the No. 4 code $B_3'$="0100" in steps 3, 4 and 2. In the same manner, the No. 5 code $B_4'$="0010", the No. 6 code $B_5'$="0001", and the No. 7 code $B_6'$="0000" are produced. since the No. 7 code $B_6'$ is equal to the No. 1 code $B_1'$, the MSB is set at 1, producing the No. 8 code $B_6'$="1000" in steps 3 and 5. Because the No. 8 code $B_6'$ is the same as the No. 3 code $B_2'$ and the MSB is already 1, the No. 8 code $B_6'$ is shifted to the left until the MSB becomes 0, i.e., is shifted back to code $B_5'$ whose MSB is 0. The code "1001" which is produced by setting the MSB of code $B_5'$ at 1 is set as the new code $B_5'$ in steps 3 and 5. This code $B_5'$="1001" is not equal to any of the previous codes and N is not 16. Therefore, code $B_5'$ is shifted one bit to the right and the MSB bit is set at 0 to produce the No. 10 code $B_6'$="0100" in step 3, 4 and 2. In this manner, the sixteenth code $B_{16}'$="0001" is produced at No. 36. Then, step 6 determines whether the No. 37 code "0000" is the same as the initial code or not. Since the No. 37 code is the same as the initial code, the desired sequence of random numbers is obtained.

The sequence of random numbers thus produced may be of any desired length N. Therefore, it is posssible to produce an absolute encoder having a resolution N, the

TABLE 3

| No. | 20 | 19 | 18 | 17 | 16 | 15 | 14 | 13 | 12 | 11 | 10 | 9 | 8 | 7 | 6 | 5 | 4 | 3 | 2 | 1 | CODE |
|---|---|---|---|---|---|---|---|---|---|---|---|---|---|---|---|---|---|---|---|---|---|
| 1 | | | | | | | | | | | | | | | | | 0 | 0 | 0 | 0 | 1 |
| 2 | | | | | | | | | | | | | | | | 0 | 0 | 0 | 0 | | 2 |
| 3 | | | | | | | | | | | | | | | | 1 | 0 | 0 | 0 | | 2 |
| 4 | | | | | | | | | | | | | | | | 0 | 1 | 0 | 0 | | 3 |
| 5 | | | | | | | | | | | | | | | 0 | 0 | 1 | 0 | | | 4 |
| 6 | | | | | | | | | | | | | | 0 | 0 | 0 | 1 | | | | 5 |
| 7 | | | | | | | | | | | | | 0 | 0 | 0 | 0 | | | | | 6 |
| 8 | | | | | | | | | | | | | 1 | 0 | 0 | 0 | | | | | 6 |
| 9 | | | | | | | | | | | | | 1 | 0 | 0 | 1 | | | | | 5 |
| 10 | | | | | | | | | | | | 0 | 1 | 0 | 0 | | | | | | 6 |
| 11 | | | | | | | | | | | | 1 | 1 | 0 | 0 | | | | | | 6 |
| 12 | | | | | | | | | | | 0 | 1 | 1 | 0 | | | | | | | 7 |
| 13 | | | | | | | | | | 0 | 0 | 1 | 1 | | | | | | | | 8 |
| 14 | | | | | | | | | 0 | 0 | 0 | 1 | | | | | | | | | 9 |
| 15 | | | | | | | | 0 | 0 | 0 | 0 | | | | | | | | | | 10 |
| 16 | | | | | | | | 1 | 0 | 0 | 0 | | | | | | | | | | 10 |
| 17 | | | | | | | | | 1 | 0 | 0 | 1 | | | | | | | | | 9 |
| 18 | | | | | | | | | | 1 | 0 | 1 | 1 | | | | | | | | 8 |
| 19 | | | | | | | | | 0 | 1 | 0 | 1 | | | | | | | | | 9 |
| 20 | | | | | | | | 0 | 0 | 1 | 0 | | | | | | | | | | 10 |
| 21 | | | | | | | | 1 | 0 | 1 | 0 | | | | | | | | | | 10 |
| 22 | | | | | | | 0 | 1 | 0 | 1 | | | | | | | | | | | 11 |
| 23 | | | | | | | 1 | 1 | 0 | 1 | | | | | | | | | | | 11 |
| 24 | | | | | | 0 | 1 | 1 | 0 | | | | | | | | | | | | 12 |
| 25 | | | | | | 1 | 1 | 1 | 0 | | | | | | | | | | | | 12 |
| 26 | | | | | 0 | 1 | 1 | 1 | | | | | | | | | | | | | 13 |
| 27 | | | | 0 | 0 | 1 | 1 | | | | | | | | | | | | | | 14 |
| 28 | | | 0 | 0 | 0 | 1 | | | | | | | | | | | | | | | 15 |
| 29 | | 0 | 0 | 0 | 0 | | | | | | | | | | | | | | | | 16 |
| 30 | 1 | 0 | 0 | 0 | | | | | | | | | | | | | | | | | 16 |
| 31 | | 1 | 0 | 0 | 1 | | | | | | | | | | | | | | | | 15 |
| 32 | | | 1 | 0 | 1 | 1 | | | | | | | | | | | | | | | 14 |
| 33 | | | | 1 | 1 | 1 | 1 | | | | | | | | | | | | | | 13 |
| 34 | | | 0 | 1 | 1 | 1 | | | | | | | | | | | | | | | 14 |
| 35 | | 0 | 0 | 1 | 1 | | | | | | | | | | | | | | | | 15 |
| 36 | 0 | 0 | 0 | 1 | | | | | | | | | | | | | | | | | 16 |
| 37 | 0 | 0 | 0 | 0 | | | | | | | | | | | | | | | | | 1 |
| | | | | | 1 | 1 | 1 | 1 | 0 | 1 | 0 | 1 | 1 | 0 | 0 | 1 | 0 | 0 | 0 | 0 | |

SEQUENCE OF RANDOM NUMBERS

First, "0000" is set as the initial random number code $B_1'$ in step 1. Code $B_1'$ is shifted one bit to the right, and the MSB is set at 0, producing the No. 2 code $B_2'$="0000" in step 2. Since code $B_1'$ and Code $B_2'$ are equal to each other, the MSB thereof is changed to 1, and the No. 3 code $B_2'$="1000" is produced in steps 3 encoder including a code plate having slits corresponding to the sequence of random numbers. Another encoder having resolution N with incremental slits may also be produced instead of the encoder with a random number of slits. It is also possible to provide a multi-rotation-type absolute encoder having means on one code plate or one rotational central shaft for producing incremental pulses, one for each revolution, and a means for counting the produced pulses with a counter.

Figure 4:
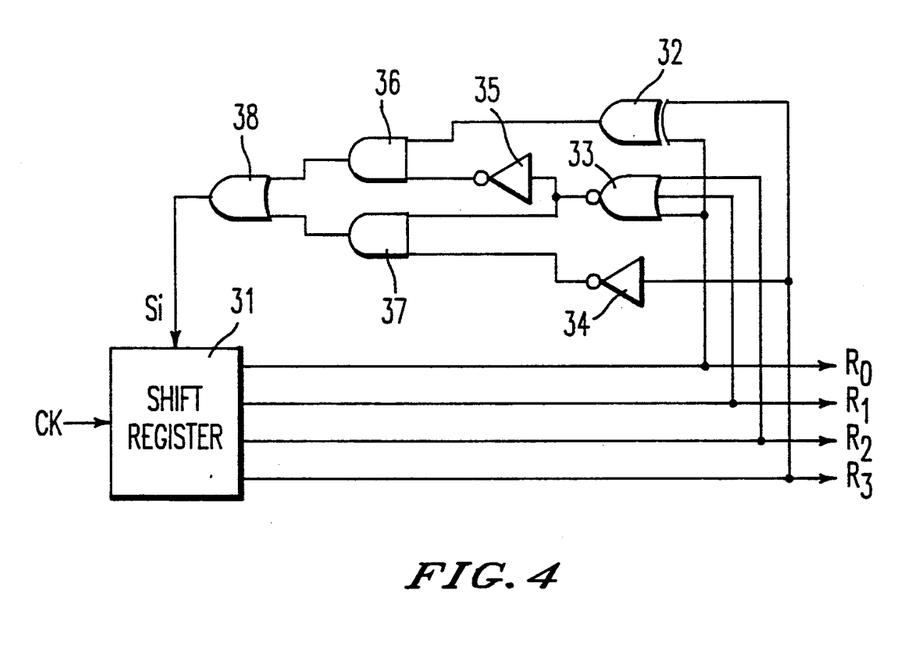
FIG. 4 is a block diagram of the random number code generator for generating 4-bit random number codes shown in Table 2.

FIG. 4 is a block diagram of the random code generator for generating the 4-bit random number codes shown in Table 2.

The random code generator comprises a shift register 31, an exclusive-OR gate 32, a NOR gate 33, inverters 34, 35, AND gates 36, 37, and an OR gate 38. The random code generator includes an additional circuit arrangement for adding 0 to a pattern transition 1000→0001 produced by the circuit shown in FIG. 7, so that pattern transitions 1000→0000→0001 can be achieved. More specifically, when all three of the bits $R_0$ through $R_3$ are 0, the next shift input is determined according to the value of $R_3$. Otherwise, the random code generator shown in FIG. 4 produces the same patterns as those of the circuit shown in FIG. 7.

Using the code plate shown in FIG. 3, four adjacent bits are detected and the detected data are shifted until they agree with the output $R_0$ through $R_3$ of the circuit shown in FIG. 4. Depending on the number of pulses registered on the shift clock, the position of the code plate can be uniquely determined. In this manner, there can be provided an absolute encoder having a resolution of $2^k$.

Figure 5:
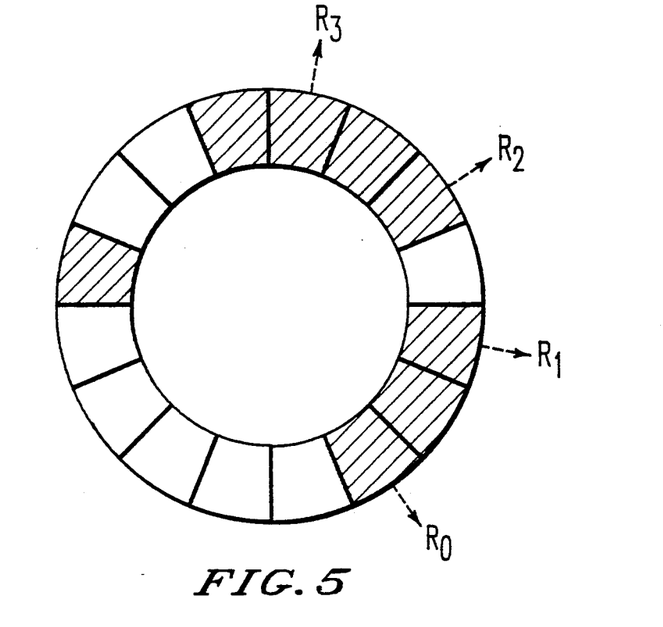
FIG. 5 is a view showing the code plate of an absolute encoder according to a second embodiment of the present invention.

FIG. 5 shows the code plate of an absolute encoder according to the second embodiment of the present invention.

If the shaded areas on the code plate are read as "0" and the blank areas on the code plate as "1", a sequence of recurring random numbers:

$$\underbrace{0001000111110110}_{\text{one circumference}}\ldots$$

is produced. When these areas are read as adjacent 4-bit sequences of numbers $R_0$ through $R_3$ which are one bit apart, one circumference of the code plate is divided into 16 different patterns as shown at $R_0$ through $R_3$ in Table 4, below. Thus, an absolute encoder can be provided using such a code plate. Unlike the first embodiment, a detector device is arranged to detect bits that are one bit apart. Therefore, the absolute encoder according to the second embodiment is physically much more feasible than the absolute encoder according to the first embodiment.

TABLE 4

| No. | $R_3$ | $R_2$ | $R_1$ | $R_0$ |
| --- | --- | --- | --- | --- |
| 1 | 0 | 0 | 0 | 0 |
| 2 | 0 | 1 | 0 | 1 |
| 3 | 0 | 0 | 0 | 1 |
| 4 | 1 | 0 | 1 | 1 |
| 5 | 0 | 0 | 1 | 1 |
| 6 | 0 | 1 | 1 | 1 |
| 7 | 0 | 1 | 1 | 0 |
| 8 | 1 | 1 | 1 | 1 |
| 9 | 1 | 1 | 0 | 1 |
| 10 | 1 | 1 | 1 | 0 |
| 11 | 1 | 0 | 1 | 0 |
| 12 | 1 | 1 | 0 | 0 |
| 13 | 0 | 1 | 0 | 0 |
| 14 | 1 | 0 | 0 | 1 |
| 15 | 1 | 0 | 0 | 0 |
| 16 | 0 | 0 | 1 | 0 |

Table 5 shows the process for generating the sequence of recurring random numbers shown in Table 4 using the algorithm shown in FIG. 2. Here, the parameters are N=16, M=1, P=4 bits, and the codes are shfited to the right. A random number code produced each time control reaches step 13 shown in FIG. 2 is shown in Table 5.

TABLE 5

| No. | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | CODE |
| --- | --- | --- | --- | --- | --- | --- | --- | --- | --- | --- | --- | --- | --- | --- | --- | --- | --- | --- | --- | --- | --- | --- | --- | --- | --- |
| 1 | | | | | | | | | | | | | | | | | 1 | | 0 | | 0 | | 0 | | 1 |
| 2 | | | | | | | | | | | | | | | | | | 0 | | 0 | | 0 | | 0 | 2 |
| 3 | | | | | | | | | | | | | | | | 0 | | 1 | | 0 | | 0 | | | 3 |
| 4 | | | | | | | | | | | | | | | 0 | | 0 | | 0 | | 0 | | | | 4 |
| 5 | | | | | | | | | | | | | | | 1 | | 0 | | 0 | | 0 | | | | 4 |
| 6 | | | | | | | | | | | | | | | | 1 | | 0 | | 0 | | 0 | | | 2 |
| 7 | | | | | | | | | | | | | | | | 1 | | 0 | | 0 | | 1 | | | 2 |
| 8 | | | | | | | | | | | | | | | 0 | | 1 | | 0 | | 0 | | | | 3 |
| 9 | | | | | | | | | | | | | | 0 | | 1 | | 0 | | 0 | | | | | 4 |
| 10 | | | | | | | | | | | | | | 1 | | 1 | | 0 | | 0 | | | | | 4 |
| 11 | | | | | | | | | | | | | 0 | | 0 | | 1 | | 0 | | | | | | 5 |
| 12 | | | | | | | | | | | | | | 0 | | 1 | | 1 | | 0 | | | | | 6 |
| 13 | | | | | | | | | | | | 0 | | 0 | | 0 | | 1 | | | | | | | 7 |
| 14 | | | | | | | | | | | | 0 | | 0 | | 1 | | 1 | | | | | | | 8 |
| 15 | | | | | | | | | | | 0 | | 0 | | 0 | | 0 | | 0 | | | | | | 9 |
| 16 | | | | | | | | | 0 | | 0 | | 0 | | 1 | | | | | | | | | | 10 |
| 17 | | | | | | | | | | 1 | | 0 | | 0 | | 1 | | | | | | | | | 10 |
| 18 | | | | | | | | | | 1 | | 0 | | 1 | | 1 | | | | | | | | | 8 |
| . | | | | | | | | | | | | | | | | | | | | | | | | | . |
| . | | | | | | | | | | | | | | | | | | | | | | | | | . |
| . | | | | | | | | | | | | | | | | | | | | | | | | | . |
| 106 | | | 0 | | 0 | | 0 | | 0 | | | | | | | | | | | | | | | | 15 |
| 107 | | 0 | | 0 | | 0 | | 1 | | | | | | | | | | | | | | | | | 16 |
| 108 | | 1 | | 0 | | 0 | | 1 | | | | | | | | | | | | | | | | | 16 |
| 109 | | | 1 | | 0 | | 1 | | 0 | | | | | | | | | | | | | | | | 14 |
| 110 | | | | 1 | | 1 | | 0 | | 1 | | | | | | | | | | | | | | | 12 |
| 111 | | | | | | | 1 | | 1 | | 1 | | 1 | | | | | | | | | | | | 8 |
| 112 | | | | | | 0 | | 1 | | 1 | | 0 | | | | | | | | | | | | | 9 |
| 113 | | | | | | | 0 | | 1 | | 1 | | 1 | | | | | | | | | | | | 10 |
| 114 | | | | | | 0 | | 0 | | 1 | | 1 | | | | | | | | | | | | | 11 |
| 115 | | | | | 0 | | 0 | | 1 | | 1 | | | | | | | | | | | | | | 12 |
| 116 | | | | | | 1 | | 0 | | 1 | | 1 | | | | | | | | | | | | | 12 |

TABLE 5-continued

| No. | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | CODE |
|---|---|---|---|---|---|---|---|---|---|---|---|---|---|---|---|---|---|---|---|---|---|---|---|---|---|
| 117 | | | | | 0 | | 0 | | 0 | | | 1 | | | | | | | | | | | | | 13 |
| 118 | | | | | | 0 | | 1 | | 0 | | 1 | | | | | | | | | | | | | 14 |
| 119 | | | | 0 | | 0 | | 0 | | 0 | | | | | | | | | | | | | | | 15 |
| 120 | | | 0 | | 0 | | 1 | | 0 | | | | | | | | | | | | | | | | 16 |
| 121 | | 1 | | 0 | | 0 | | 0 | | | | | | | | | | | | | | | | | 1 |
| 122 | 1 | | 0 | | 0 | | 1 | | | | | | | | | | | | | | | | | | 2 |
| SEQUENCE OF RANDOM NUMBERS | | | | | | | | | 0 | 0 | 1 | 1 | 1 | 1 | 1 | 0 | 1 | 1 | 0 | 0 | 0 | 0 | 1 | 0 | |

First, "1000" is set as the sequences of numbers 1 and $B'_1$ at No. 1 and "0000" as the sequences of numbers 2 and $B'_2$ at No., 2. The sequence of numbers 1 is shifted to the right in step 12, producing the No. 3 code $B'_3$. Since no previous code is equal to the No. 3 code $B'_3$ in step 13, control goes to step 14. As N is not 16, control goes to step 15 in which the sequence of numbers 1 is replaced with the sequence of numbers 2, after which control goes to step 12 again. The new sequence of numbers 1 is shifted to the right, producing the No. 4 code $B'_4$. Because the No. 4 code $B'_4$ is equal to code $B'_2$ in step 13, the No. 5 code $B'_4$ is produced in steps 16 and 17. The No. 5 code $B'_4$ is the same as $B'_1$ in step 13. Therefore, control goes to step 16 again. Because the MSB is 1, the code is shifted back to code $B'_2$, whose MSB is 0. In step 17, the No. 6 code is produced as the new code $B'_2$. Since the new code $B'_2$ is equal to code $B'_1$ in step 13, control goes to step 16 again. Though the MSB is also 1 at this time, since the code is also the initial code $B'_2$, the No. 7 code $B'_2$ is produced as the new code in steps 21 and 22 and control then goes to step 13. The above process is subsequently repeated.

The sixteenth code $B'_{16}$ is produced at No. 120. Since the No. 121 and No. 122 are the same as the initial codes $B'_1$, $B'_2$, the desired sequence of random numbers is obtained.

Figure 6:
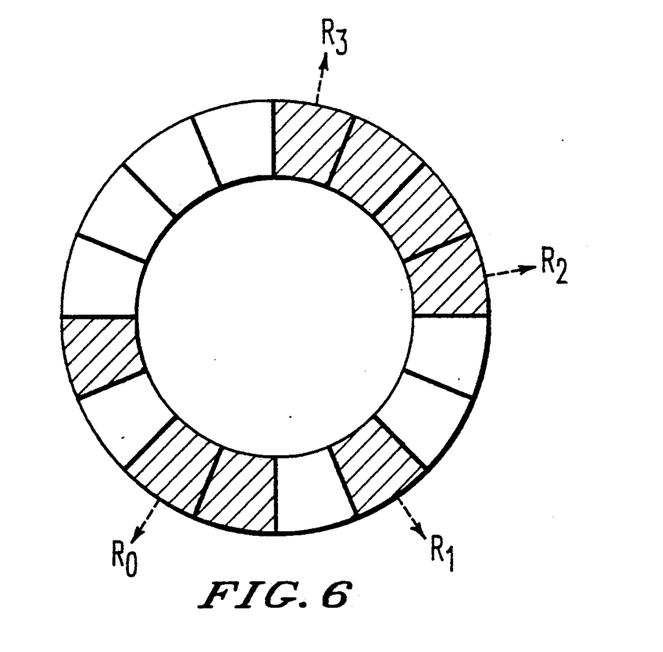
FIG. 6 is a view showing a code plate of the absolute encoder according to the third embodiment of the present invention.

FIG. 6 shows the code plate of an absolute encoder according to the third embodiment of the present invention.

If the shaded areas on the code plate are read as "0" and the blank areas on the code plate as "1", a sequence of recurring random numbers:

$$\underbrace{0000110100101111}_{\text{one circumference}}$$

is produced. When these areas are read as an adjacent 4-bit sequence of numbers $R_0$ through $R_3$ which are two bits apart as shown in FIG. 6, one circumference of the code plate is divided into 16 different patterns as shown at $R_0$ through $R_3$ in Table 6, below. Thus, an absolute encoder can be provided using such a code plate. Unlike the second embodiment, the detector device is arranged to detect bits that are two bits apart. Therefore, the absolute encoder according to the third embodiment is physically much more feasible than the absolute encoder according to the first embodiment.

TABLE 6

| No. | $R_3$ | $R_2$ | $R_1$ | $R_0$ |
|---|---|---|---|---|
| 1 | 0 | 0 | 0 | 0 |
| 2 | 0 | 1 | 1 | 1 |
| 3 | 0 | 1 | 0 | 0 |
| 4 | 0 | 0 | 0 | 1 |
| 5 | 1 | 1 | 1 | 1 |
| 6 | 1 | 0 | 0 | 1 |
| 7 | 0 | 0 | 1 | 1 |
| 8 | 1 | 1 | 1 | 0 |
| 9 | 0 | 0 | 1 | 0 |
| 10 | 0 | 1 | 1 | 0 |
| 11 | 1 | 1 | 0 | 0 |
| 12 | 0 | 1 | 0 | 1 |
| 13 | 1 | 1 | 0 | 1 |
| 14 | 1 | 0 | 0 | 0 |
| 15 | 1 | 0 | 1 | 1 |
| 16 | 1 | 0 | 1 | 0 |

Table 7 shows the process for generating the sequence of recurring random numbers shown in Table 6 using the algorithm shown in FIG. 2. Here, the parameters are N=16, M=2, P=4 bits, and the codes are shifted to the right. The random number code produced each time control reaches step 13 shown in FIG. 2 is shown in Table 7.

TABLE 7

| No. | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | CODE |
|---|---|---|---|---|---|---|---|---|---|---|---|---|---|---|---|---|---|---|---|---|---|---|---|---|---|---|---|---|---|
| 1 | | | | | | | | | | | | | | | | | | | 1 | | 0 | | 0 | | 0 | | | | 1 |
| 2 | | | | | | | | | | | | | | | | | | 1 | | 0 | | 0 | | 0 | | | 1 | | 2 |
| 3 | | | | | | | | | | | | | | | | | 0 | | 0 | | 0 | | 0 | | | | | | 3 |
| 4 | | | | | | | | | | | | | | | | 0 | | 1 | | 0 | | 0 | | | | | | | 4 |
| 5 | | | | | | | | | | | | | | | 0 | | 1 | | 0 | | 0 | | | | | | | | 5 |
| 6 | | | | | | | | | | | | | | | 1 | | 1 | | 0 | | 0 | | | | | | | | 5 |
| 7 | | | | | | | | | | | | | 0 | | 0 | | 0 | | 0 | | | | | | | | | | 6 |
| 8 | | | | | | | | | | | | | 1 | | 0 | | 0 | | 0 | | | | | | | | | | 6 |
| 9 | | | | | | | | | | | | | | | | | 1 | | 0 | | 0 | | | 0 | | | | | 3 |
| 10 | | | | | | | | | | | | | | | | | 1 | | 0 | | 0 | | | 1 | | | | | 3 |
| 11 | | | | | | | | | | | | | | | | | 1 | | 0 | | 1 | | | 0 | | | | | 3 |
| 12 | | | | | | | | | | | | | | | 0 | | 1 | | 0 | | 0 | | | | | | | | 4 |
| 13 | | | | | | | | | | | | | | 0 | | 1 | | 0 | | 0 | | | | | | | | | 5 |
| 14 | | | | | | | | | | | | | | 1 | | 1 | | 0 | | 0 | | | | | | | | | 5 |
| 15 | | | | | | | | | | | | | 0 | | 1 | | 0 | | 1 | | | | | | | | | | 6 |
| 16 | | | | | | | | | | | | 0 | | 0 | | 1 | | 0 | | | | | | | | | | | 7 |
| 17 | | | | | | | | | | | 0 | | 1 | | 1 | | 0 | | | | | | | | | | | | 8 |
| 18 | | | | | | | | | | 0 | | 0 | | 1 | | 0 | | | | | | | | | | | | | 9 |
| . | | | | | | | | | | | | | | | | | | | | | | | | | | | | | |
| . | | | | | | | | | | | | | | | | | | | | | | | | | | | | | |
| . | | | | | | | | | | | | | | | | | | | | | | | | | | | | | |

TABLE 7-continued

| No. | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | CODE |
|---|---|---|---|---|---|---|---|---|---|---|---|---|---|---|---|---|---|---|---|---|---|---|---|---|---|---|---|---|---|
| 835 |  |  |  |  |  |  | 1 |  |  | 0 |  |  | 0 |  |  | 0 |  |  |  |  |  |  |  |  |  |  |  |  | 13 |
| 836 |  |  |  |  |  |  |  | 1 |  |  | 0 |  |  | 0 |  |  | 0 |  | 1 |  |  |  |  |  |  |  |  |  | 10 |
| 837 |  |  |  |  |  |  |  |  | 0 |  |  | 1 |  |  | 1 |  |  | 1 |  |  |  |  |  |  |  |  |  |  | 11 |
| 838 |  |  |  |  |  |  |  |  |  | 0 |  |  | 0 |  |  | 0 |  | 1 |  |  |  |  |  |  |  |  |  |  | 12 |
| 839 |  |  |  |  |  |  |  |  | 0 |  |  | 1 |  |  | 0 |  | 0 |  |  |  |  |  |  |  |  |  |  |  | 13 |
| 840 |  |  |  |  |  | 0 |  |  | 0 |  |  | 1 |  |  | 1 |  |  |  |  |  |  |  |  |  |  |  |  |  | 14 |
| 841 |  |  |  |  |  |  | 1 |  |  | 0 |  |  | 1 |  |  | 1 |  |  |  |  |  |  |  |  |  |  |  |  | 14 |
| 842 |  |  |  |  |  |  |  | 1 |  |  | 1 |  |  | 1 |  |  | 1 |  |  |  |  |  |  |  |  |  |  |  | 11 |
| 843 |  |  |  |  |  |  | 0 |  |  | 0 |  |  | 0 |  |  |  | 1 |  |  |  |  |  |  |  |  |  |  |  | 12 |
| 844 |  |  |  |  |  | 0 |  |  | 1 |  |  | 0 |  |  | 0 |  |  |  |  |  |  |  |  |  |  |  |  |  | 13 |
| 845 |  |  |  |  | 0 |  |  | 1 |  |  | 1 |  |  | 1 |  |  |  |  |  |  |  |  |  |  |  |  |  |  | 14 |
| 846 |  |  |  | 0 |  |  | 0 |  |  | 0 |  |  | 0 |  |  |  |  |  |  |  |  |  |  |  |  |  |  |  | 15 |
| 847 |  |  | 0 |  |  | 0 |  |  | 1 |  |  | 0 |  |  |  |  |  |  |  |  |  |  |  |  |  |  |  |  | 16 |
| 848 |  |  | 1 |  |  | 0 |  |  | 1 |  |  | 0 |  |  |  |  |  |  |  |  |  |  |  |  |  |  |  |  | 16 |
| 849 |  | 1 |  |  | 0 |  |  | 1 |  |  | 1 |  |  |  |  |  |  |  |  |  |  |  |  |  |  |  |  |  | 1 |
| 850 | 1 |  |  | 0 |  |  | 0 |  |  | 0 |  |  |  |  |  |  |  |  |  |  |  |  |  |  |  |  |  |  | 2 |
| 851 | 1 |  | 1 |  |  | 0 |  |  | 1 |  |  |  |  |  |  |  |  |  |  |  |  |  |  |  |  |  |  |  | 3 |
|  |  |  |  |  |  |  |  |  |  |  |  |  | 0 | 0 | 1 | 0 | 1 | 1 | 1 | 1 | 0 | 0 | 0 | 0 | 1 | 1 | 0 | 1 |  |

SEQUENCE OF RANDOM NUMBERS

First, "1000" is set as the sequence of numbers 1, $B'_1$ at No. 1, "1001" as the sequence of numbers 2, $B'_2$ at No. 2, and "0000" as the sequence of numbers 3, $B'_3$ at No. 3. The sequence of numbers 1 is shifted to the right in step 12, producing the No. 4 code $B'_4$. Since no previous code is equal to the No. 4 code $B'_4$ in step 13, control goes to step 14. As N is not 16, control goes to step 15 in which the sequence of numbers 2 is replaced with the new sequence of numbers 1, the sequence of numbers 3 with the new sequence of numbers 2, and the sequence of numbers 1 with the new sequence of numbers 3, after which control goes to step 12 again. The new sequence of numbers 1 is shifted to the right, producing the No. 5 code $B'_5$. Because the No. 5 code $B'_5$ is equal to code $B'_4$ in step 13, the No. 6 code $B'_5$ is produced in steps 16 and 17. There is no code equal to the No. 6 code $B'_5$ in step 13. Therefore, the sequences of numbers 1, 2, 3 are replaced in steps 14 and 15 and control goes to step 12 again, producing the No. 8 code $B'_6$. Since there is a code equal to the No. 8 code $B'_6$ in step 13, control goes to step 16. Because the MSB is 1, the code is shifted back to code $B'_3$, whose MSB is 0. In step 17, the No. 9 code is produced as the new code $B'_3$. Since the new code $B'_3$ is equal to code $B'_1$ in step 13, control returns to step 16. Though the MSB is also 1 at this time, since the code is initial code $B'_3$, the No. 10 code $B'_3$ is produced as the new code in steps 21 and 22, and control goes to step 13. The above process is subsequently repeated.

The sixteenth code $B'_{16}$ produced at No. 848. Since the No. 848, No. 849 and No. 850 are the same as the initial codes $B'_1$, $B'_2$, $B'_3$ (not shown), the desired sequence of random numbers is obtained.

Figure 8:
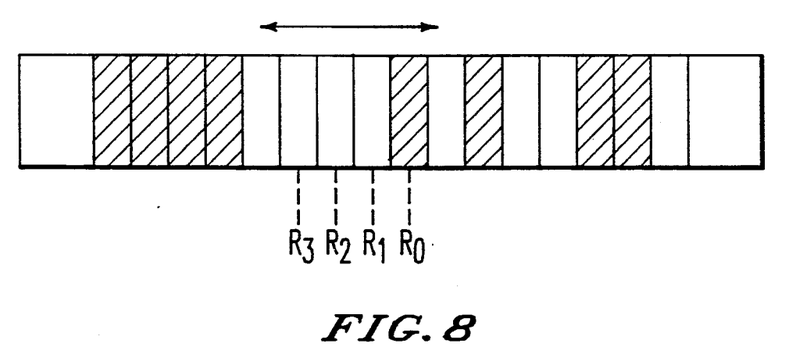
FIG. 8 is a view showing the code plate for a linear encoder.

In each of the above embodiments, the present invention has been described with reference to the rotary-type slit code plate. The present invention is also applicable to a linear-type code plate. Where a linear-type code plate is employed, as shown in FIG. 8, an absolute position can be determined within the range of N-P slits. The above description is directed to an optical encoder. If the present invention is incorporated in a magnetic encoder, bits 1 and 0 may be represented by magnetic pole patterns of N and S poles.

While a preferred embodiment of the invention has been described using specific terms, such description is for illustrative only, and it is to be understood that changes and variations may be made without departing from the sprit or scope of the following claims.

We claim:

1. An absolute encoder comprising a code plate divided into N equal slits, each represented by a code 0 or 1, for producing a sequence of recurring random numbers whose binary codes ($B_1$–$B_N$), composed of successive P slits, are different from each other, and a detector device for reading the codes of successive P slits of the code plate so that the absolute angle of the code plate within one revolution can be detected, characterized in that:

the slits are arranged to carry out the process of generating N sequences of random numbers, the process comprising initially setting a P-bit random number code represented by 1 and 0, the binary code being referred to as $B'_1$, and, at the first stage, shifting the initial random number code one bit to the right or the left (if the code is shifted to the left, the process in the parentheses below is effected), setting the MSB (or the LSB) at 0, determining whether the second P-bit binary code $B'_2$ thus produced is identical to the initial code $B'_1$ or not, and if not equal, adding 0 to the lefthand (or the righthand) side of the MSB (or the LSB) of the P-bit random number code to produce a (P+1)-bit random number code, and at a second stage, shifting the random number code one bit to the right (or the left), setting the MSB (or the LSB) at 0, determining whether the third P-bit binary code $B'_3$ thus produced is identical to codes $B'_1$, $B'_2$ or not, and if not equal, adding 0 or 1 to the lefthand (or the righthand) side of the MSB (or the LSB) of the (P+1)-bit random number code to produce a (P+2)- bit random number code, and repeating the above process until an N-bit random number code is determined; and if identical binary codes are present in any of the stages, shifting the random number code to the left (or the right) up to the stage in which the MSB (or the LSB) becomes 0, converting 0 at the MSB (or the LSB) into 1, determining whether the code is identical to the initially set binary code or not, and if not equal, shifting the code to the right (or the left), and if equal, shifting the code to the left (or the right).

2. An absolute encoder comprising a code plate divided into N equal slits, each represented by a code 0 or 1, for producing a code of recurring random numbers whose N random number codes, composed of successive P slits ($N = 2^P$), are a combination of M-series random number codes and a code of 0s, and a shift register for generating data having the same structure as the code of recurring random numbers.

3. An absolute encoder comprising a code plate divided into N equal slits, each represented by a code 0 or 1, for producing a sequence of recurring random numbers whose P-bit binary codes ($B_1$-$B_N$), composed of successive P slits which are M bits apart, are different from each other, and a detector device for reading the codes of successive P slits which are M slits apart, from the code plate, so that the absolute angle of the code plate within one revolution can be detected, characterized in that:

the slits are arranged to carry out the process of generating N sequences of random numbers, the process comprised initially setting different $M+1$ sequences of numbers $1, 2, \ldots, M+1$, each represented by P 1s and 0s, the binary codes being referred to as $B'_1, B'_2, \ldots, B'_{M+1}$, and initially setting a sequence of random numbers having a length $(M+1)P$ by arranging the bits of the sequences of numbers $1, 2, \ldots, M+1$ in the order of the sequences of numbers $1, 2, \ldots, M+1$, and, at the first stage, shifting the initial code of the sequence of numbers 1 one bit to the right or the left (if the code is shifted to the left, the processing in the parentheses below is effected), setting the MSB (or the LSB) at 0 to produce a new sequence of numbers 1, determining whether a $(M+2)$th P-bit binary code $B'_{M+2}$ thus produced is identical to the codes $B'_1, B'_2, \ldots, B'_{M+1}$ or not, if not equal, adding 0 to the lefthand (or the righthand) side of the MSB (or the LSB) of the $(M+1)P$ sequences of random numbers to produce $(M+1)P+1$ sequences of random numbers, replacing the sequence of numbers 2 with a new sequence of numbers 1, ..., the sequence of numbers $M+1$ with a new sequence of numbers M, and the sequence of numbers 1 with a new sequence of numbers $M+1$, shifting the new sequence of numbers 1 one bit to the right (or the left), setting the MSB (or the LSB) thereof at 0, determining whether a $(M+3)$th P-bit binary code $B'_{M+3}$ thus produced is identical to the codes $B'_1, B'_2, \ldots, B'_{M+2}$, and if not equal, adding 0 to the lefthand side (or the righthand side) of the MSB (or the LSB) of the $(M+1)P+1$-bit sequence of random numbers to produce an $(M+1)P+2$-bit sequence of random numbers, and repeating the above process until N random number codes are determined;

if identical binary codes are present in each of the stages, and if the present code is not identical to the initially set codes $B'_1, B'_2, \ldots, B'_{M+1}$, shifting the sequence of numbers 1, the sequence of numbers 2, ..., the sequence of numbers $M+1$, and the sequence of random numbers to the left (or the right) up to the stage in which the MSB (or the LSB) of the sequence of numbers 1 becomes 0, converting 0 at the MSB (or the LSB) into 1, determining whether the produced binary code is identical to the initially set binary codes or not, and if not equal, shifting the binary code to the right (or the left), and if equal, shifting the binary code to the left (or the right); and if the present code is identical to the initially set codes $B'_1, B'_2, \ldots, B'_{M+1}$, and if the present code is not of the maximum value that can be taken by the P-bit binary code, setting the code produced by incrementing the present code by 1 as the new initially set code and repeating the steps from the determining step, and if the preset code is of the maximum value that can be taken by the P-bit binary code, finishing the process because the generation of a sequence of random numbers is impossible.

4. An absolute encoder according to any one of claims 1 through 3, wherein the N recurring random number codes are partly cut off, and the code plate is of a linear arrangement.

* * * * *